United States Patent
Mao et al.

(10) Patent No.: US 10,704,138 B2
(45) Date of Patent: Jul. 7, 2020

(54) VACUUM HEATING DEVICE

(71) Applicants: BOE TECHNOLOGY GROUP CO., LTD., Beijing (CN); Hefei BOE Display Technology Co., Ltd., Hefei, Anhui (CN)

(72) Inventors: Ruifeng Mao, Beijing (CN); Sangkee Kim, Beijing (CN); Guanjie Cheng, Beijing (CN); Yuanhu Li, Beijing (CN)

(73) Assignees: BOE TECHNOLOGY GROUP CO., LTD., Beijing (CN); HEFEI BOE DISPLAY TECHNOLOGY CO., LTD., Hefei, Anhui (CN)

( * ) Notice: Subject to any disclaimer, the term of this patent is extended or adjusted under 35 U.S.C. 154(b) by 356 days.

(21) Appl. No.: 15/675,576

(22) Filed: Aug. 11, 2017

(65) Prior Publication Data

US 2018/0142344 A1    May 24, 2018

(30) Foreign Application Priority Data

Nov. 24, 2016  (CN) .................... 2016 2 1280567 U

(51) Int. Cl.
| | | |
|---|---|---|
| *H01J 1/00* | (2006.01) | |
| *C23C 14/50* | (2006.01) | |
| *H01J 37/34* | (2006.01) | |
| *C23C 14/35* | (2006.01) | |
| *C23C 14/54* | (2006.01) | |
| *C23C 14/56* | (2006.01) | |
| *G02F 1/1333* | (2006.01) | |
| *G02F 1/13* | (2006.01) | |

(52) U.S. Cl.
CPC .............. *C23C 14/50* (2013.01); *C23C 14/35* (2013.01); *C23C 14/54* (2013.01); *C23C 14/56* (2013.01); *C23C 14/564* (2013.01); *H01J 37/3405* (2013.01); *G02F 1/1303* (2013.01); *G02F 1/133305* (2013.01); *H01J 2237/2001* (2013.01)

(58) Field of Classification Search
CPC .................... H01J 2237/2001; C23C 14/50
See application file for complete search history.

(56) References Cited

U.S. PATENT DOCUMENTS

| | | | | |
|---|---|---|---|---|
| 4,369,730 A | * | 1/1983 | Izu ......................... | C23C 16/545 118/50.1 |
| 5,881,649 A | * | 3/1999 | Hasegawa ......... | H01L 21/67709 104/167 |
| 6,091,055 A | * | 7/2000 | Naka .................... | F27B 9/2476 219/388 |
| 2016/0223259 A1 | * | 8/2016 | Korecki ................. | C21D 1/06 |

* cited by examiner

*Primary Examiner* — Jason Berman
(74) *Attorney, Agent, or Firm* — Kinney & Lange, P.A.

(57) ABSTRACT

The present disclosure provides a vacuum heating device including: a vacuum chamber; a plurality of heating units each provided in the vacuum chamber to heat a tray; and a nitrogen gas generator unit configured to be in fluid communication with the vacuum chamber.

8 Claims, 1 Drawing Sheet

VACUUM HEATING DEVICE

CROSS-REFERENCE TO RELATED APPLICATION

The present application claims priority to Chinese Patent Application No. 201621280567.X, filed on Nov. 24, 2016, entitled "VACUUM HEATING DEVICE", which is incorporated herein by reference in its entirety.

BACKGROUND

Technical Field

The present disclosure relates to technical field of display, and particularly to a vacuum heating device.

Description of the Related Art

When a vertical type magnetron sputtering apparatus is used for plating on a glass substrate in industry of a thin film transistor liquid crystal display, an aluminum target is commonly used to plate the glass substrate. Although usage of the aluminum target reduces manufacturing cost, plating by the aluminum target on a glass substrate needs to maintain a pure atmosphere where the glass substrate is located. Otherwise, protrudes and hard spots are tend to be generated on an aluminum film formed by the aluminum target. During plating a film on the glass substrate by using the aluminum target, a tray is used as a carrying tool to supporting the glass substrate within a chamber during plating, and thus purity and cleaning of the tray is especially important for the plating.

In the prior art, the tray is commonly stored in an atmospheric environment at a room temperature after usage and may absorb impurity gas such as water vapor in air under the atmospheric environment. In this instant, when the tray absorbing the impurity gas supports a glass substrate within a chamber again, the impurity gas absorbed will cause the plating environment to be abnormal, and thus cause formation of an abnormal film on the glass substrate when plating on the glass substrate by using the aluminum target, leading a reduced product yield.

SUMMARY

The present disclosure provides a vacuum heating device, which can avoid pollution of impurity gas from the tray that absorbs a large number of impurity gas in an atmosphere environment, when it is used again, and thus avoid the re-usage of the tray from causing abnormal gas atmosphere for plating and reduced product yield.

The present disclosure provides a vacuum heating device including: a vacuum chamber; a plurality of heating units each configured in the vacuum chamber to heat a tray; and a nitrogen gas generator unit configured to be in fluidly communication with the vacuum chamber.

As an aspect, the vacuum heating device further includes: a slide guiding track arranged in a bottom of the vacuum chamber and configured to guide the tray to enter the vacuum chamber; a plurality of first posts disposed at the bottom of the vacuum chamber to support the heating units and arrayed to space from one another; and a magnetic claw disposed within and at top of the vacuum chamber and configured to fix the tray.

As an aspect, the vacuum heating device includes: a plurality of vacuum sub-chambers that are in fluidly communication with one another, the nitrogen gas generator unit is in fluidly communication with each of the plurality of vacuum sub-chambers and one of the heating units is provided in each of the plurality of vacuum sub-chambers.

As an aspect, the vacuum heating device further includes: a vacuum pump configured to pump out gas within the vacuum chamber and being in fluidly communication with each of the plurality of vacuum sub-chambers.

As an aspect, the vacuum heating device is further provided with a gas discharge unit configured to discharge impurity gas and being in fluidly communication with each of the plurality of vacuum sub-chambers.

As an aspect, the vacuum heating device is further provided with a heating control unit configured to control the heating unit and being coupled to each of the plurality of heating units.

As an aspect, a loading opening is disposed at a side of the vacuum chamber and is provided with a sealing gate.

As an aspect, the vacuum heating device further includes: a ventilating baffle plate configured between two adjacent vacuum sub-chambers and to separate them.

As an aspect, the vacuum heating device further includes: an airtight baffle plate configured between two adjacent vacuum sub-chambers and to separate them; wherein a plurality of second posts, disposed at a bottom of the airtight baffle plate, are arrayed to space from one another, and in contact with the bottom of the vacuum sub-chamber to allow gas communication between the vacuum sub-chambers.

As an aspect, the heating units are heating plates and a support piece is provide on a heating surface of each of the heating plates to prevent the tray from directly contacting the heating plate.

BRIEF DESCRIPTION OF THE DRAWINGS

The drawings herein are provided to further understand the present disclosure and constitute a part of the present disclosure. The schematic drawings and their description are tended to interpret the present disclosure instead of limiting the present disclosure. In the drawings.

DETAILED DESCRIPTION OF THE EMBODIMENTS

In order to further illustrate a vacuum heating device according to embodiments of the present disclosure, description in detail is made in conjunction with the drawings.

Figure 1:
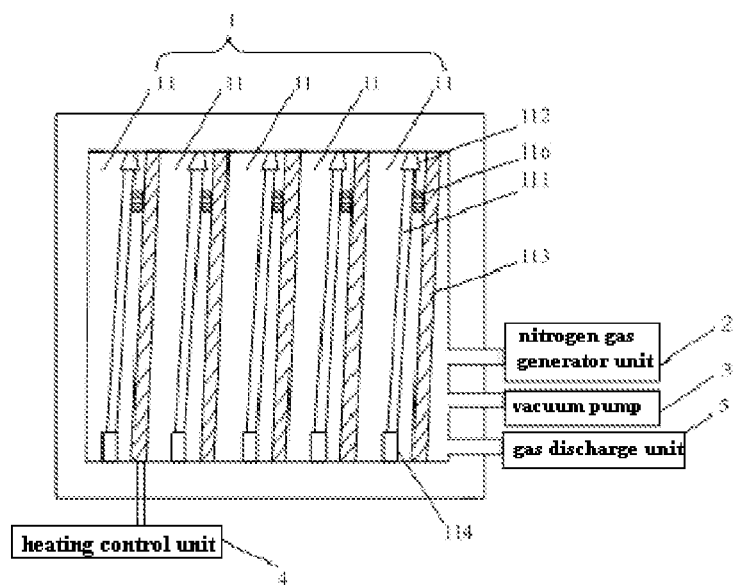
FIG. 1 is a cross sectional view of a vacuum heating device according to an embodiment of the present disclosure.
Figure 2:
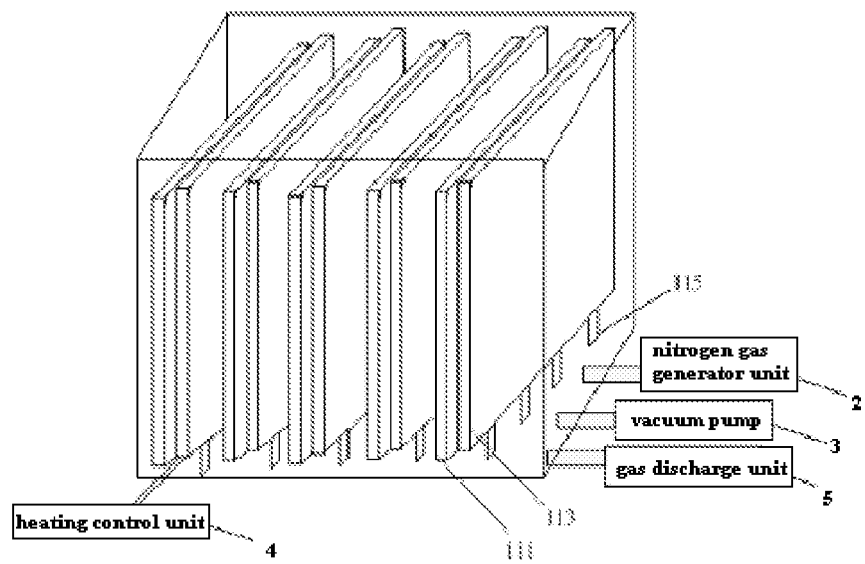
FIG. 2 is a structural perspective view of a vacuum heating device according to an embodiment of the present disclosure.

Referring to FIGS. 1 and 2, a vacuum heating device according to embodiments of the present disclosure includes a vacuum chamber 1, a plurality of heating units 113 arranged in the vacuum chamber 1 to heat a tray 111; and a nitrogen gas generator unit 2 configured to be in fluid communication with the vacuum chamber 1.

In an implementation, the tray 111 is placed within the vacuum chamber and the nitrogen gas generator unit 2 generates nitrogen gas in the vacuum chamber 1. The generated nitrogen gas may expel air out from the vacuum chamber 1. As the vacuum chamber is in a vacuum state, the heating unit 113 heats the tray 111 such that impurity gas in the tray 111 may be discharged effectively under the vacuum condition at high temperature. From the above implementation, the vacuum chamber 1 in the embodiment is provided with the heating unit 113 therein such that the tray 111 may be heated by the heating unit 113 when the tray 111 is placed within the vacuum chamber 1. As the tray 113 is in an environment of vacuum at a high temperature, the impurity gas absorbed by the tray 111 may be effectively discharged, which can not only elongate service life of the tray 111 but also ensure no impurity gas absorbed by the tray 111 and causing abnormity of atmosphere in the plating condition when the tray 111 supports a glass substrate during plating. Thus, as for plating a glass substrate by using an aluminum target, plating quality of the glass substrate may be improved and product yield thus may be increased. In addition, the vacuum chamber 1 is in fluid communication with the nitrogen gas generator unit 2 such that the nitrogen gas generated by the nitrogen gas generator unit 2 ensures the impurity gas discharged will not be re-absorbed by the tray 111 in a short time period.

It is noted that, in an embodiment of the present disclosure, in order to increase space utilization of the vacuum chamber 1 and save inner space of the vacuum chamber 1, the nitrogen gas generator unit 2 may be located outside of the vacuum chamber 1 and be in fluid communication with the vacuum chamber 1 through a conduit.

Continuously referring to FIGS. 1 and 2, in the vacuum heating device according to the above embodiments, a slide guiding track 114 is provided at the bottom of the vacuum chamber 1 and configured to guide the tray 111 to enter the vacuum chamber 1. Further, a plurality of first posts 115 are provided at the bottom of the vacuum chamber 1 and configured to support the heating units 113. The first posts 115 are arranged to space apart from one another or at an interval. A magnetic clamp 112 is disposed within and at top of the vacuum chamber 1, and configured to fix the tray 111. In the vacuum heating device according to the embodiment, convenience of loading the tray 111 to and unloading the tray 111 from the vacuum chamber 1 may be improved largely.

In an implementation, as the tray 111 to be heated is placed on the slide guiding track 114, the slide guiding track 114 may not only support the tray 111 but also accurately guide the tray 111 into a preset place where the tray 111 is to be placed within the vacuum chamber 1. With this configuration, it allows the tray 111 to be delivered into the vacuum chamber 1 and be taken out of the vacuum chamber 1. When the tray 111 is delivered to the preset place where the tray 111 is to be placed, the magnetic engagement member 112 absorbs and fixes the tray 111 by means of an attraction force, achieving automatic fixation of the tray 111.

From the above implementation, the slide guiding track 114 cooperates with the magnetic engagement member 112 such that the tray 111 may be conveniently loaded into and fixed within the vacuum chamber 1, and be prevented from accidently wobbling and thus be damaged during heating by the heating unit 113. In addition, since the plurality of first posts 115 are arrayed to space apart from one another to provide gaps among them, the first posts 115 may not only function to fix the heating units 113 but also allow gas within the vacuum chamber 1 to communicate through the gaps formed among the first posts 115, thereby ensuring flowability of the gas within the vacuum chamber 1.

In an embodiment of the present disclosure, the slide guiding track 114 may be a guiding track vehicle as required, in which a plurality of wheels are provided at bottom thereof and disposed to space one another. The number of the wheels is set according to size and weight of the tray. Usage of guiding track vehicle to support the tray and allow the tray to enter or exit the vacuum chamber 1 allows the gas within the vacuum chamber 1 to flow through gaps among the wheels of the guiding track vehicle. In addition, due to a simply structure of the guiding track vehicle, maintenance of the guiding track vehicle becomes more convenient.

According to an embodiment of the disclosure, referring to FIG. 1, in the vacuum heating device of the above embodiments, the vacuum chamber 1 includes a plurality of vacuum sub-chambers 11, which are in fluid communication with one another and each of which is in fluid communication with the nitrogen gas generator unit 2. One of the heating units 113 is provided in each of the vacuum sub-chambers 11, such that the tray 111 in the vacuum sub-chamber 11 may be heated by using the corresponding heating unit 113. That is, the plurality of vacuum sub-chambers 11 are used to heat the plurality of trays 111 simultaneously, which largely increases heating efficiency of the trays 111 within the vacuum chamber 1. Further, due to configuration of the vacuum sub-chambers 11 being in fluid communication with one another, only one nitrogen gas generator unit 2 may achieve fully filling of the nitrogen gas into the vacuum sub-chambers 11, thereby reducing the number of the nitrogen gas generator unit 2 and thus reducing product cost. In addition, as the configuration of the vacuum sub-chambers may function to separate heat and gas, a tray 111 in a vacuum sub-chamber is subject to less influence from a process of taking another tray 111 from another vacuum sub-chamber, i.e., heat and nitrogen gas consumption may be reduced.

Referring to FIG. 1, in order to ensure vacuum state in each of the vacuum sub-chambers 11, the vacuum heating device according to an embodiment further includes a vacuum pump configured to pump out the gas from the vacuum chamber 1. The vacuum pump 3 is in fluid communication with each of the vacuum sub-chambers 11.

In an implementation, the nitrogen gas generator unit 2 firstly inputs nitrogen gas into each vacuum sub-chamber 11 to expel air and part of impurity gas from the vacuum sub-chambers 11. When nitrogen gas fully fills each of the vacuum sub-chambers 11, nitrogen gas generator unit 2 is stopped to input the nitrogen gas into the vacuum sub-chambers 11. Then, the vacuum pump 3 is started to pump out gas from the vacuum sub-chambers 11 that are in fluid communication with the vacuum pump 3, to make each of the vacuum sub-chambers 11 to be in a vacuum state. From the above implementation, it is known that, as the vacuum pump 3 is in fluid communication with the vacuum sub-chambers 11, only one vacuum pump 3 may pump out air/gas within the vacuum sub-chambers 11 to render them to be in the vacuum state. Further, the vacuum pump 3 may also pump out a part of the impurity gas discharged from the tray 111 at the high-temperature vacuum state while pumping out the gas within the vacuum sub-chambers 11, thereby increasing discharging efficiency of the impurity gas.

In an embodiment of the present disclosure, the vacuum pump 3 is placed outside of the vacuum chamber 1 and is in fluid communication with the vacuum chamber 1 through a conduit, thereby increasing space usage rate within the vacuum chamber and saving inner space within the vacuum chamber 1.

In a further embodiment of the present disclosure, referring to FIGS. 1 and 2, the vacuum heating device is further provided with a gas discharge unit 5 configured to discharge the impurity gas. The gas discharge unit 5 is in fluid communication with each of the vacuum sub-chambers 11. During continuously heating the tray 11 in the vacuum state, the gas discharge unit 5 discharges the impurity gas discharged from the tray 111 placed within the vacuum sub-chamber from the vacuum sub-chamber 11, avoiding the impurity gas discharged during the vacuum heating process from staying within the vacuum sub-chamber 11 and thus from being re-absorbed by the tray 111 and re-polluting the tray 111.

In order to increase the space usage rate of the vacuum chamber 1 and save the inner space of the vacuum chamber 1, according to an embodiment, the gas discharge unit 5 is placed outside the vacuum chamber 1 and is in fluid communication with the vacuum chamber through a conduit.

In an embodiment of the present disclosure, referring to FIGS. 1 and 2, the vacuum heating device is further provided with a heating control unit 4 configured to control the heating units 113. The heating control unit 4 is coupled to each of the heating units 113, so as to accurately control a heating temperature of the heating unit 113.

In an implementation, the heating control unit 4 has two user-selectable control modes. One is a manual set mode and the other is an automatic set mode. When a user chooses the manual set mode, the user sets manually the heating temperature of each of the heating units 113 according to actual requirements. When the user chooses the automatic set mode, the heating control unit 4 will automatically adjust the heating temperature of the heating units 113 depending on an impurity gas content absorbed by the trays 111 to be heated within the vacuum sub-chambers 11, so as to completely discharge the impurity gas in the trays 111 to be heated within the vacuum sub-chambers 11.

From the above implementation, the heating control unit 4 may adjust the heating temperature of the heating units 113 within the vacuum sub-chambers 11, and may set the heating temperature of the heating unit 113 within each of the vacuum sub-chambers 11 depending on the impurity gas contained by the tray 111 within the vacuum sub-chambers 11, thereby ensuring completely discharging the impurity gas in the tray 111 at a suitable heating temperature. In addition, the heating control unit 4 provides two control modes selectable for the user. In the actual implementation, the user may choose one control mode of the heating control unit 113 according to actual requirement, increasing convenience and flexibility of operation.

It is noted that the default mode of the heating control unit 4 is the manual set mode. The heating temperature of the heating unit 113 in each of the vacuum sub-chambers 11 is set as a default value of 200 degree.

In addition, referring to FIG. 2, in the vacuum heating device according to the above embodiments, a loading opening is provided at a side of the vacuum chamber 1. A sealing gate is provided over the loading opening. Provision of the sealing gate may not only facilitate loading the tray 111 into and unloading the tray 111 from each of the vacuum sub-chambers 11, but also ensure the vacuum state within the vacuum chamber 1 during heating the trays 111.

In an embodiment of the present disclosure, referring to FIG. 1, the vacuum heating device 11 further includes a ventilating baffle plate provided between two adjacent vacuum sub-chambers to separate them.

In an implementation, the ventilating baffle plate is provided with a plurality of vents to ensure the gas freely flowing within the vacuum sub-chamber 11.

In another embodiment of the present disclosure, referring to FIG. 1, the vacuum heating device includes an airtight baffle plate arranged between two adjacent vacuum sub-chambers to separate them. In the embodiment, a plurality of second posts, provided at a bottom of the airtight baffle plate, are arranged to space apart from one another and being in contact with the bottoms of the two adjacent vacuum sub-chambers to allow gas communication between the vacuum sub-chambers through gaps between the second posts provided at the bottoms of the vacuum sub-chambers. The configuration of the embodiment may be manufactured easily and reliably.

In an embodiment of the present disclosure, referring to FIG. 1, the heating units 113 of the vacuum heating device are heating plates, and a support piece 116 is provide on a heating surface of each of the heating plate to prevent the tray 111 from contacting the heating plate.

In the embodiment, the heating units 113 are the heating plates and the support piece 116 is provided in each heating plate to prevent the heating plate from directly contacting the tray 111 and thus damaging the tray 111. Meanwhile, non-contact between the tray 111 and the heating plate is advantage for uniformly heating process of the tray 111.

In the above description of the embodiments, specific features, structure, material or characteristics may be combined in a suitable manner in any one or more embodiments or examples.

The above description is merely made for illustrating the embodiments of the present disclosure, instead of limiting the scope of the present disclosure. The scope of the present disclosure is not limited to this. Those skilled in the art can easy replace or change the embodiments above based on the above description and the replacement or modification shall be covered by the scope of the present disclosure. Thus, the scope of the present disclosure is defined by the claims.

The invention claimed is:

1. A vacuum heating device comprising:
   a vacuum chamber;
   a plurality of heating units each provided in the vacuum chamber to heat a tray;
   a nitrogen gas generator unit configured to be in fluid communication with the vacuum chamber;
   a slide guiding track arranged at the bottom of the vacuum chamber and configured to guide the tray to enter the vacuum chamber;
   a plurality of first posts disposed at the bottom of the vacuum chamber to support the heating units and arranged to space apart from one another;
   a magnetic clamp disposed at a top of the vacuum chamber and configured to fix the tray; and
   a plurality of vacuum sub-chambers that are in fluid communication with one another, wherein the nitrogen gas generator unit is in fluid communication with each of the plurality of vacuum sub-chambers and one of the heating units is provided in each of the plurality of vacuum sub-chambers.

2. The vacuum heating device according to claim 1, further comprising a vacuum pump configured to pump out gas from the vacuum chamber and being in fluid communication with each of the plurality of vacuum sub-chambers.

3. The vacuum heating device according to claim 1, wherein the vacuum heating device is further provided with a gas discharge unit configured to discharge impurity gas and being in fluid communication with each of the plurality of vacuum sub-chambers.

4. The vacuum heating device according to claim 1, wherein the vacuum heating device is further provided with a heating control unit configured to control the heating units and being coupled to each of the plurality of heating units.

5. The vacuum heating device according to claim 1, wherein a loading opening is disposed at a side of the vacuum chamber and is provided with a sealing gate.

6. The vacuum heating device according to claim 5, further comprising a ventilating baffle plate arranged between two adjacent vacuum sub-chambers to separate them.

7. The vacuum heating device according to claim 5, further comprising an airtight baffle plate provided between two adjacent vacuum sub-chambers to separate them; wherein a plurality of second posts are disposed at the bottom of the airtight baffle plate, arranged to space apart from one another, and in contact with the bottom of the two adjacent vacuum sub-chambers to allow gas communication between the vacuum sub-chambers.

8. The vacuum heating device according to claim 1, wherein the heating units are heating plates and a support piece is provide on a heating surface of each of the heating plates to prevent the tray from directly contacting the heating plate.

\* \* \* \* \*